United States Patent
Woo et al.

(10) Patent No.: US 6,400,640 B2
(45) Date of Patent: Jun. 4, 2002

(54) METHOD FOR MEMORY ADDRESSING

(75) Inventors: Ramchan Woo; Chi Weon Yoon; Hoi Jun Yoo, all of Taejon (KR)

(73) Assignee: Korea Advanced Institute of Science and Technology, Taejon (KR)

( * ) Notice: Subject to any disclaimer, the term of this patent is extended or adjusted under 35 U.S.C. 154(b) by 0 days.

(21) Appl. No.: 09/738,324

(22) Filed: Dec. 18, 2000

(30) Foreign Application Priority Data

Mar. 27, 2000 (KR) .......................................... 2000-15405

(51) Int. Cl.[7] .................................................. G11C 8/00
(52) U.S. Cl. .............. 365/230.06; 365/233; 365/230.02
(58) Field of Search ........................... 365/230.06, 233, 365/230.02

(56) References Cited

U.S. PATENT DOCUMENTS

| | | | | |
|---|---|---|---|---|
| 5,418,745 A | 5/1995 | Watanabe | .............. | 365/189.05 |
| 5,774,402 A | * 6/1998 | Lee | .............. | 365/191 |
| 5,777,946 A | 7/1998 | Inuzuka et al. | .............. | 365/240 |
| 5,978,296 A | * 11/1999 | Zibert | .............. | 365/222 |
| 6,191,999 B1 | * 2/2001 | Fujieda et al. | ......... | 365/230.06 |

* cited by examiner

Primary Examiner—Huan Hoang
(74) Attorney, Agent, or Firm—Foley & Lardner

(57) ABSTRACT

A Row-After-Column memory addressing method. The memory addressing method changes the order of addressing so as to enhance the efficiency of memory addressing. The Row-After-Column memory addressing method of the present invention comprises the steps of activating a column path by generating the column address when the address is input for data access, and activating a row path by generating the row address according to the address. Therefore, pipeline stall arising from inputting the column address (/CAS) subsequent to input of the row address (/RAS) can be eliminated and the speed of memory access can be enhanced.

8 Claims, 3 Drawing Sheets

METHOD FOR MEMORY ADDRESSING

BACKGROUND OF THE INVENTION

1. Field of the Invention

The present invention relates to a memory addressing method and, more particularly, to a memory addressing method in which the column address is input prior to the input of the row address.

2. Description of the Prior Art

Most computer systems use system memories by employing the address multiplexing scheme of inputting the column address subsequent to inputting the row address.

Generally, memories are devices designed to enable the storage and retrieval of data to/from a particular location. Thus, memories are provided with a data bus for data transmission and an address bus for specification of location. As the memory size increases, more addresses are required for specification of location. Accordingly, the number of pins in the memory device has to be increased, thus causing increased manufacturing cost and problems with packaging.

Therefore, from the 64 kilobit generation of memory devices, the address multiplexing scheme has been employed, wherein the cells storing data in the memory device are arranged in two dimensions and the row and column addresses are provided successively. Because in the address multiplexing scheme the row address and the column address are supplied at a different timing, the pins in the memory device can be shared.

The operation of the address multiplexing scheme will be briefly illustrated below.

First, when the row address is supplied, the row path in the two-dimension cell array is first activated so that the data stored in the selected row is read via the sense amplifier. Subsequently, the column path is activated by way of supplying the column address, so that the column data is output.

The row and column addresses are generated by the memory controller in computer systems. When the central processing unit (CPU) requests data stored in a particular address of the memory, the memory controller facilitating communication of data between the CPU and the memory converts the address specified by the CPU to row and column addresses compatible with the memory structure used in the system. In this case, the memory is operated successively by accessing the row path first and then the column path, making this memory addressing scheme very efficient. Most personal computers or workstation systems employ this memory addressing scheme in their system memories, and likewise most memory devices are designed to accommodate this memory addressing scheme.

FIG. 1 is a diagram illustrating the pipeline process of a read operation in a high speed synchronous dynamic random access memory (SDRAM), and FIG. 2 is a diagram illustrating the pipeline process of a write operation in a high speed SDRAM.

The pipeline process of a read operation will be illustrated with reference to FIG. 1. When the ROW #1 address signal is input, the row path selected by the ROW #1 address signal is activated. When the COL #1 address signal is input, the column path selected by the COL #1 address signal is activated. At this point, data is transferred from the row path to the column path, and utilizing the transferred data the column path becomes capable of independent operation without the row path. Thus, the row path can receive a new row address to carry out another operation. Therefore, in the read operation, data can be continuously accessed without pipeline stall even if the column address (/CAS) is input subsequent to the input of the row address (/RAS). However, because the order of inputting addresses is fixed in the above addressing scheme, system performance may be deteriorated. This drawback will be illustrated with reference to FIG. 2.

In a write operation, no data transfer occurs until the column address signal is input, because data is first transmitted from the outside of the memory to the column path in a write operation. When the COL #1 address signal is input as shown in FIG. 2, data can be received from the outside of the memory because the column path is activated. At this point, the row path is in the activated state in order to receive data from the column path, and the address input column maintains the stall state because another address signal cannot be input to the address input column. When the row path completes receiving data from the column path, ROW #2 address signal is sequentially input to activate the row path. At this point, the column path maintains the stall state until the COL #2 address signal is input. Thereafter, the above operation is repeated. Thus, in the write operation, pipeline stall occurs repeatedly when the column address (/CAS) is input after the row address (/RAS) is input as in the read operation. This leads directly to increase of memory data access time. That is, unlike a data read operation, in a memory write operation, data from the outside of the memory passes through the column path, and then is stored in the memory cell via the row path. However, in conventional addressing schemes, the column address is input after the row address is input, so that the two operations (read and write) cannot be superimposed. This results in inefficiency.

SUMMARY OF THE INVENTION

Therefore, it is an object of the present invention to provide, in a memory employing address multiplexing, a memory addressing method capable of increasing memory access speed by merely changing the memory addressing order in the memory read and write operations without change in system structure.

It is another object of the present invention to provide a memory addressing method capable of enhancing the efficiency in the operations of memories.

To this end, a memory addressing method is provided in a system having a memory controller that receives an address requested by a system control unit and converts the received address to a row address and a column address that is compatible with a structure of a connected memory, the memory addressing method comprising the steps of activating a column path by generating the column address when the address is input for data access, and activating a row path by generating the row address according to the address.

DESCRIPTION OF THE PREFERRED EMBODIMENT

The memory addressing method according to an embodiment of the present invention will be described hereinafter with reference to the attached drawings.

Figure 1:
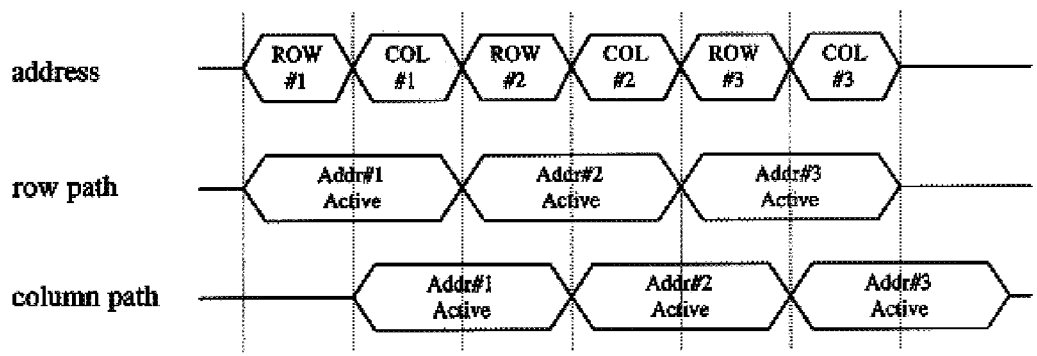
FIG. 1 is a diagram illustrating the pipeline process in a read operation of a high speed SDRAM.
Figure 2:
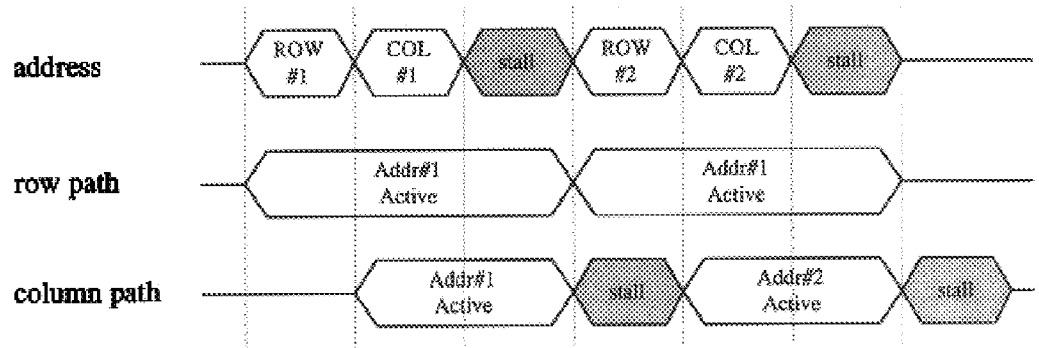
FIG. 2 is a diagram illustrating the pipeline process in a write operation of a high speed SDRAM.
Figure 3:
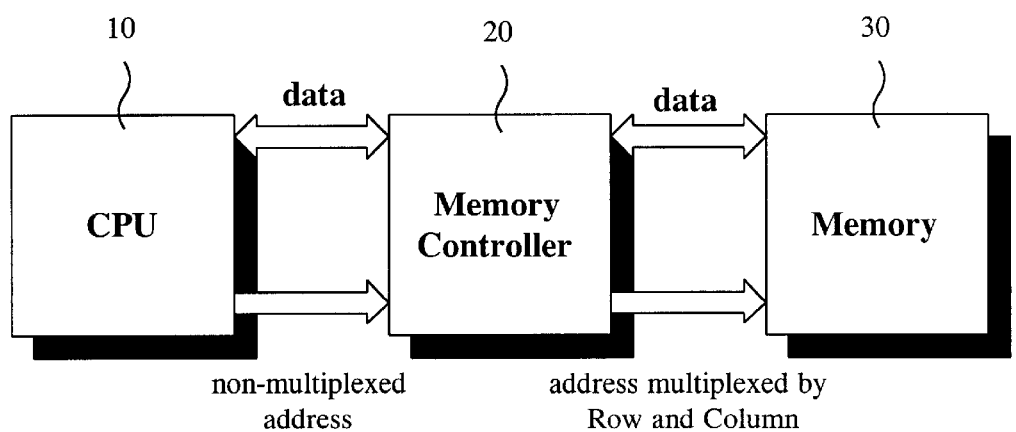
FIG. 3 is a system configuration diagram illustrating the memory addressing method according to an embodiment of the present invention.

FIG. 3 is a system configuration diagram illustrating the memory addressing method according to an embodiment of the present invention. Referring to FIG. 3, the system for implementing the memory addressing method according to an embodiment of the present invention includes a CPU 10, memory controller 20, and a memory 30. The memory controller 20 is connected to the CPU 10 and the memory 30 via a data bus and an address bus. When the CPU 10 requests data stored in a particular address of the memory 30, the memory controller 20 converts the address requested by the CPU 10 to row and column addresses compatible with the structure of the memory used in the system and transmits the row and column addresses to the memory 30.

Implementation of the present invention requires nothing more than altering the address path of the memory controller 20 in the side of the memory 30. Thus, the memory addressing method according to the embodiment of the present invention can be implemented without major changes in the hardware configuration of conventional systems.

Figure 4:
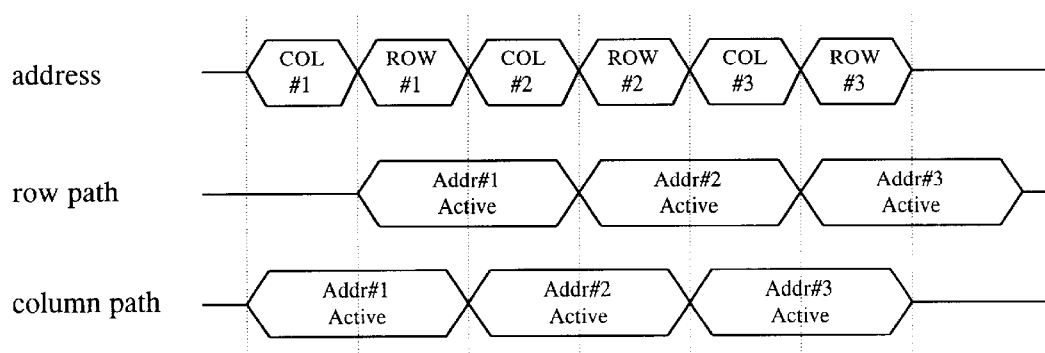
FIG. 4 is a diagram illustrating the pipeline process of a write operation in a memory addressing method according to an embodiment of the present invention.

FIG. 4 is a diagram illustrating the pipeline process of a write operation in a memory addressing method according to an embodiment of the present invention and, more particularly the pipeline process of a write operation in a SDRAM that supports Row-After-Column (RAC) addressing.

As shown in FIG. 4, when the COL #1 address signal is input, the column path selected by the COL #1 address signal is activated to receive data from the outside of the memory. Subsequently, when the ROW #1 address signal is input, the row path selected by the ROW #1 address signal is activated. At this point, data is transferred from the column path to the row path, and utilizing the transferred data the row path becomes capable of independent operation without the column path. Thus, the column address can receive a new column address to perform another operation. Thereafter, the above steps are repeated.

Accordingly, in the memory addressing method of the present invention, data can be continuously written to the memory 30 without pipeline stall even if the row address (/RAS) is input subsequent to the input of the column address (/CAS) in a write operation.

Figure 5:
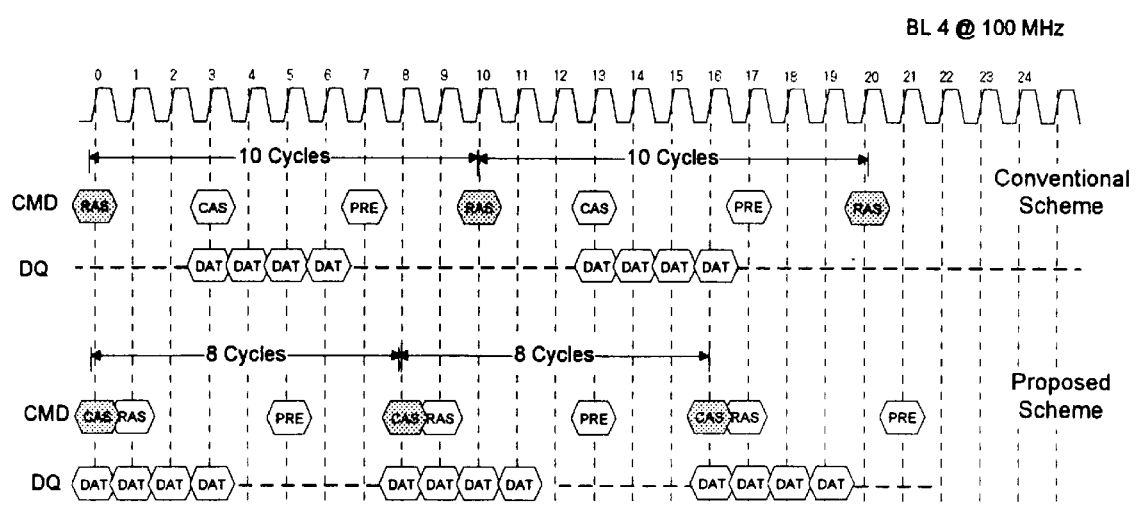
FIG. 5 is a diagram illustrating continuous write operations with respect to different rows in the same bank, as an embodiment of the present invention.

FIG. 5 is a diagram illustrating continuous write operations with respect to different rows in the same bank, as an embodiment of the present invention, and shows the timing diagram of the operations of a DRAM using a 100 MHz clock.

Referring to FIG. 5, in the conventional scheme the column address (/CAS) is input subsequent to the input of the row address (/RAS) and data is input to the data pin in synchronism with the input of the column address (/CAS). In this case, ten cycles are required in order to be ready to perform the next write operation. In contrast, in the proposed scheme the row address (/RAS) is input subsequent to the input of the column address (/CAS) and data is input in synchronism with the input of the column address (/CAS). Because the DRAM is accessed by the subsequent row address (/RAS), the operations of the columns and rows of the DRAM are performed at the same time. In this case, only eight cycles are required in order to be ready to perform the next write operation. Therefore, as the write operation continues, a big difference arises in the time required to complete write operations between the conventional memory addressing method and RAC (Row-After-Column), the memory addressing method according to the embodiment of the present invention.

In addition, the row address is activated prior to the activation of the column address in the internal operation even in a memory that does not employ address multiplexing. Thus, the addressing method (Row-After-Column) of the present invention is also compatible with a memory that does not employ address multiplexing.

As illustrated above, the present invention has advantages that pipeline stall can be eliminated and the speed of memory access can be enhanced by inputting the row address after the column address is input in a write operation. In addition, the present invention requires no more change than altering the address path of the memory controller in the memory side. Therefore, compatibility with conventional systems is maintained, and system performance can be enhanced with minimal increase in cost.

Although the present invention has been illustrated with reference to embodiments of the present invention, various modifications are possible within the scope of the present invention. Therefore, the scope of the present invention should be defined not by the illustrated embodiments but by the attached claims.

What is claimed is:

1. A memory addressing method in a system having a memory controller that receives an address requested by a system control unit and converts the received address to a row address and a column address that comply with a structure of a connected memory, the memory addressing method comprising the steps of:

activating a column path by generating the column address when the received address is input for data access; and activating a row path by generating the row address according to the received address after said column path is activated.

2. The memory addressing method as claimed in claim 1, wherein the row path is activated before the column address is activated only in a read operation of the memory.

3. A memory addressing method as claimed in claim 1, wherein the memory is a synchronous dynamic random access memory.

4. A memory addressing method as claimed in claim 2, wherein the memory is a synchronous dynamic random access memory.

5. The memory addressing method as claimed in claim 1, wherein the memory does not employ address multiplexing.

6. The memory addressing method as claimed in claim 2, wherein the memory does not employ address multiplexing.

7. The memory addressing method as claimed in claim 3, wherein the memory does not employ address multiplexing.

8. The memory addressing mentor as claimed in claim 4, wherein the memory does not employ address multiplexing.

* * * * *